United States Patent [19]

Kane

[11] Patent Number: 5,084,703
[45] Date of Patent: Jan. 28, 1992

[54] PRECISION DIGITAL-TO-ANALOG CONVERTER

[75] Inventor: Brian R. Kane, Fullerton, Calif.

[73] Assignee: Beckman Industrial Corporation, Fullerton, Calif.

[21] Appl. No.: 684,215

[22] Filed: Apr. 12, 1991

[51] Int. Cl.$^5$ ............................................. H03M 1/78
[52] U.S. Cl. .................................... 341/154; 341/119
[58] Field of Search ....................... 341/119, 153, 154

[56] References Cited

U.S. PATENT DOCUMENTS

| | | | |
|---|---|---|---|
| 4,381,499 | 4/1983 | Struthoff | 341/154 |
| 4,551,709 | 11/1985 | Merchant et al. | 341/154 |
| 4,590,456 | 5/1986 | Burton et al. | 341/154 |
| 4,713,649 | 12/1987 | Hino | 341/154 |
| 4,800,365 | 1/1989 | White et al. | 341/119 |
| 5,008,671 | 4/1991 | Tuthill | 341/136 |

Primary Examiner—A. D. Pellinen
Assistant Examiner—Marc S. Hoff
Attorney, Agent, or Firm—Plante, Strauss Vanderburgh & Connors

[57] ABSTRACT

A digital-to-analog converter is disclosed which employs a ladder configuration comprising a series of R1-R2-R3 stages in which resistors R2 and R3 are selected so that mathematically the combined resistance of R2 in parallel with R3 is equal to twice the resistance of R1. The resistance of resistor R3 is on the order of 3 to 30 times greater than the resistance of resistor R2. These resistors are configured in stages with FET switches.

9 Claims, 2 Drawing Sheets

PRECISION DIGITAL-TO-ANALOG CONVERTER

FIELD OF THE INVENTION

This invention relates to digital-to-analog converters, and more particularly to digital-to-analog converters having a high output linearity accuracy.

BACKGROUND OF THE INVENTION

Digital-to-analog converters, i.e., electronic devices which convert digital binary input to an analog signal for output purposes, such as for data display or the like, have an accuracy barrier which, as a practical matter, limits the number of bits of digital input which can be processed. The accuracy barrier has been attacked by a number of different approaches with the majority of the efforts applied to the standard R/2R ladder configuration with the Herman Schmid switch adaptation. This configuration consists of a plurality of stages, a stage for each bit of information ranging from the most significant bit to the least significant bit, utilizing a transistor switch (FET) as the current switching device. This configuration requires that each successive FET in the configuration have twice the ON resistance of the FET in the previous stage to achieve current balance and temperature drift compensation. As a practical matter, the resolution of monolithic converters employing the R/2R ladder configuration seem to have reached an apparent practical limit of about 12 bits. A 12 bit converter, for example, would require FET geometry variation (between the most significant bit FET and the least significant bit FET) of $2^{11}$, or 1 to 2048. This approach leaves the FET as a major source of difficulty from the standpoint of manufacturing transistors which will accurately have the required geometry and electrical characteristics. In addition, it will be understood that the cost of such converters is directly affected by these requirements.

SUMMARY OF THE INVENTION

It is, therefor, an object of the present invention to provide a digital-to-analog converter (DAC) capable of high resolution and accuracy in excess of 12 bits.

Another object of the invention is to provide a digital-to-analog converter employing a ladder configuration in which the FETs required are essentially equivalent in geometry and ON resistance.

Still another object of the invention is to provide a digital-to-analog converter which provides high accuracy and which can be manufactured at lower cost.

In accordance with the present invention there is provided a digital-to-analog converter which employs a ladder configuration comprising a series of R1-R2-R3 stages in which resistors R2 and R3 are selected so that mathematically the combined resistance of R2 in parallel with R3 is equal to twice the resistance of R1. The resistance of resistor R3 is on the order of 3 to 30 times greater than the resistance of resistor R2. These resistors are configured in stages with FET switches.

In one embodiment, as the resistance of R3 becomes very large, R2 approaches 2 times R1. In this case R1 and R2 form a voltage divider which establishes a binary weighted reference voltage for each bit. However, if the resistance of R3 becomes excessively large, it begins to affect the speed of the converter. In a preferred embodiment, the resistance of R3 is approximately 10 times that of R2.

In accordance with the present invention FET tolerances can be relaxed since the effect of their ON resistances on the reference ladder is diminished. Also, because the FET parameters can be relaxed to be merely essentially equal at each stage of the ladder, variations in FET geometry are reduced since the dimensions of the FET can remain relatively constant. Since the FET parameters can be essentially equal, the cost of manufacturing FETs and the ultimate cost of the converter can be significantly reduced.

These and other objects and advantages of the present invention will become apparent from the following detailed description taken in conjunction with the drawings.

DETAILED DESCRIPTION OF THE INVENTION

Figure 1:
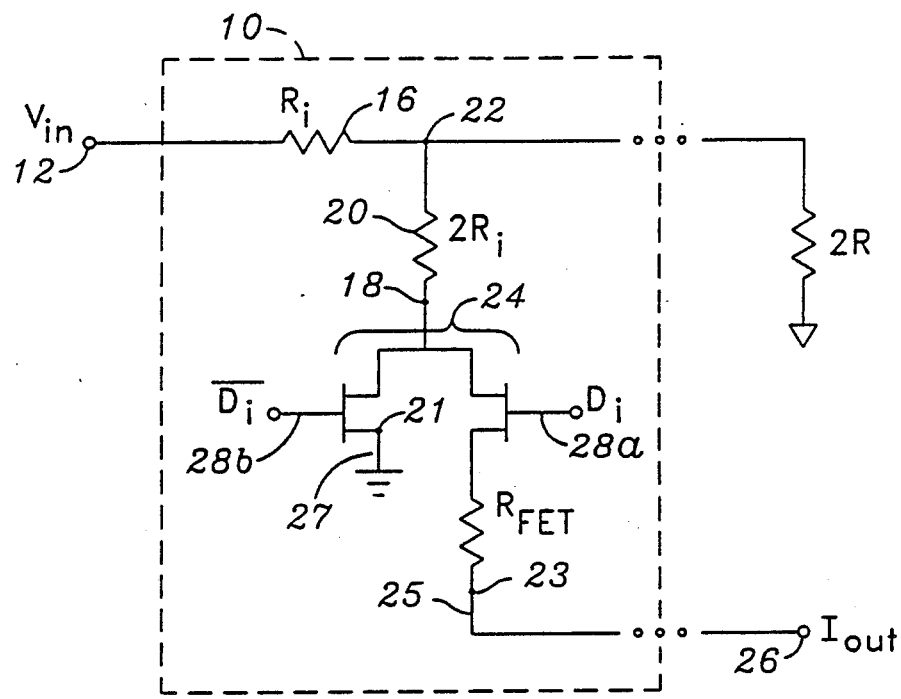
FIG. 1 is a schematic representation of the circuitry in a digital-to-analog converter utilizing an R/2R ladder in accordance with the prior art.

Referring to FIG. 1, one stage 10 of (n) stages of a DAC is illustrated utilizing the R/2R configuration of the prior art. As is well known to those skilled in the art, each stage, when interconnected, manages one bit of digital resolution. A reference voltage, or the prior stage, enters this stage at a point 12. A first resistor 16 is attached between this point 12 and a point 22. A second resistor 20 is attached between point 22 and a current switch 24 at point 18. The resistance of the second resistor 20 is twice that of the first resistor 16 in accordance with the R/2R ladder configuration. As shown, the current switch 24 is comprised of two identical transistors (FETs) connected together at their drains to create an SPDT switch. The switch receives a digital signal ($D_i$) at point 28a and its complement ($\overline{D_i}$) point 28b and processes the signal in a manner well understood in the art to direct the current flowing into the switch 18 either to output 21 which is connected to the common analog ground 27, or to output 23 which is connected to output terminal 26 which also receives the output from the stages which are prior and subsequent to the stage 10. Point 22 is additionally connected to the input of the subsequent stage; or, in the case of the final stage, through a resistor of value equal to resistor 20 to ground 27. Normally, the output will be connected to a summing junction (not shown) for summing the currents transmitted from each stage. The circuit design for a summing junction is well understood in the art and does not per se form a part of this invention.

The resulting signal, which may be output as current or converted to voltage, represents the analog of the digital signal which was input into the converter. It is well understood that with switching circuits of the R/2R type as illustrated in FIG. 1, the ON resistance of the FET in each of the stages must be closely controlled in order to maintain linearity over a range of temperatures. The ON resistance for the FET in the R/2R configuration must be twice that of the ON resistance of the FET in a preceding stage. Thus a 12 bit digital-to-analog converter would require FET geometry variation between the most significant bit FET and the least significant bit FET of $2^{11}$, or 1 to 2048. For this reason, converters built utilizing the R/2R configuration with the Herman Schmid modification for FETs typically cannot exceed 12 bits as the ON resistance and size of the last FETs in the ladder become too great. In addition, as mentioned, it is difficult to match FETs in the manner required and thus linearity and accuracy suffer, particularly when handling the digital signals in excess of about 12 bits.

Figure 2:
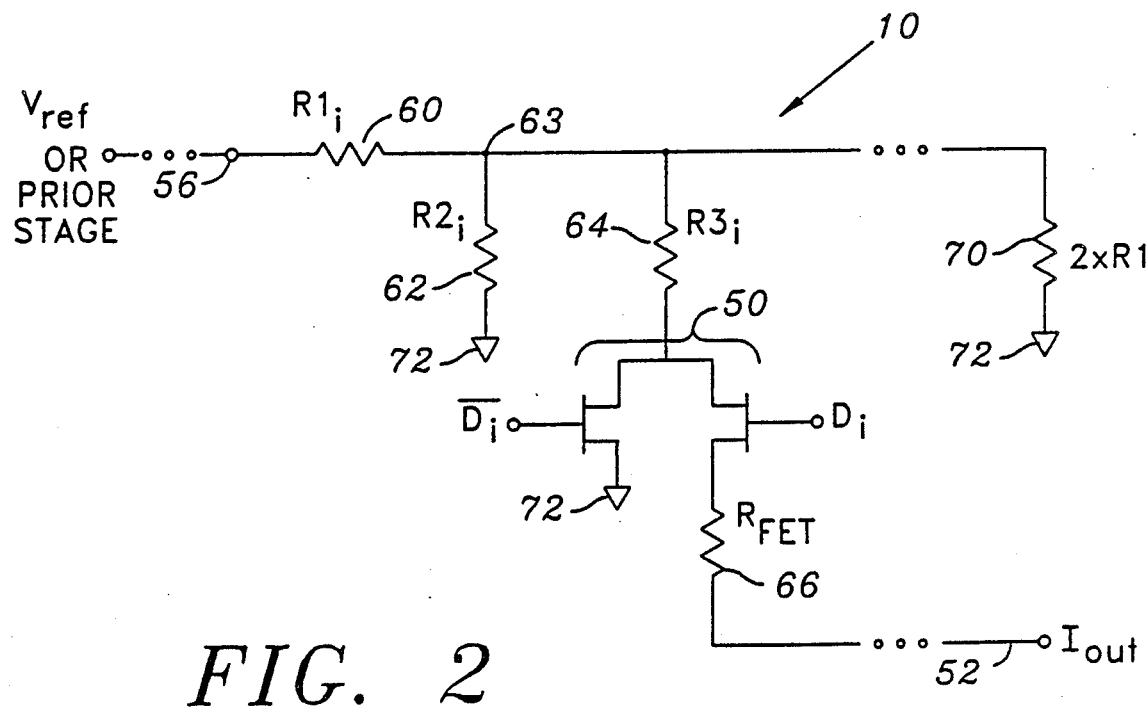
FIG. 2 is a schematic representation of a single switching stage in accordance with the present invention.

The resistance relationships are illustrated by FIG. 2 which illustrates the circuitry for a single state (i) which is identical for each of the stages of the converter. A reference voltage (or the prior stage) is attached at point 56. A resistor $R1_i$ is attached between point 56 and point 63. point 63 is attached to the input of the subsequent stage, or, in the case of the final stage, to a resistor 70 of resistance $=2 \times R1$ which is attached to ground 72. The first ends of resistors R2 and S3 (62 and 64 respectively are connected to connected to ground 72 while the second end of resistor $R3_i$ is connected to the switch 50 input. The switch 50 is composed of two identical transistors (FET's). The FETs are controlled by complimentary digital input control lines $D_i$ and $\overline{D_i}$ in a manner well understood by those versed in the art to turn one of the FET pair on, and the other FET off. One FET source is attached to ground 72, and the other FET source is attached to the common current summing line 52. The ON resistance of the switch is schematically represented as a resistance 66 ($R_{fet}$), and the ON resistance of the switch 50 is equivalent to the ON resistance of the switch in the previous stage (i-1). The relationship between resistances is such that $2 \times R1i = (R2_i \times R3_i)/(R2_i + R3_i)$. And further, the resistance of $R3_i$ is on the order of 3 to 40 times greater than the resistance of $R2_i$.

Figure 3:
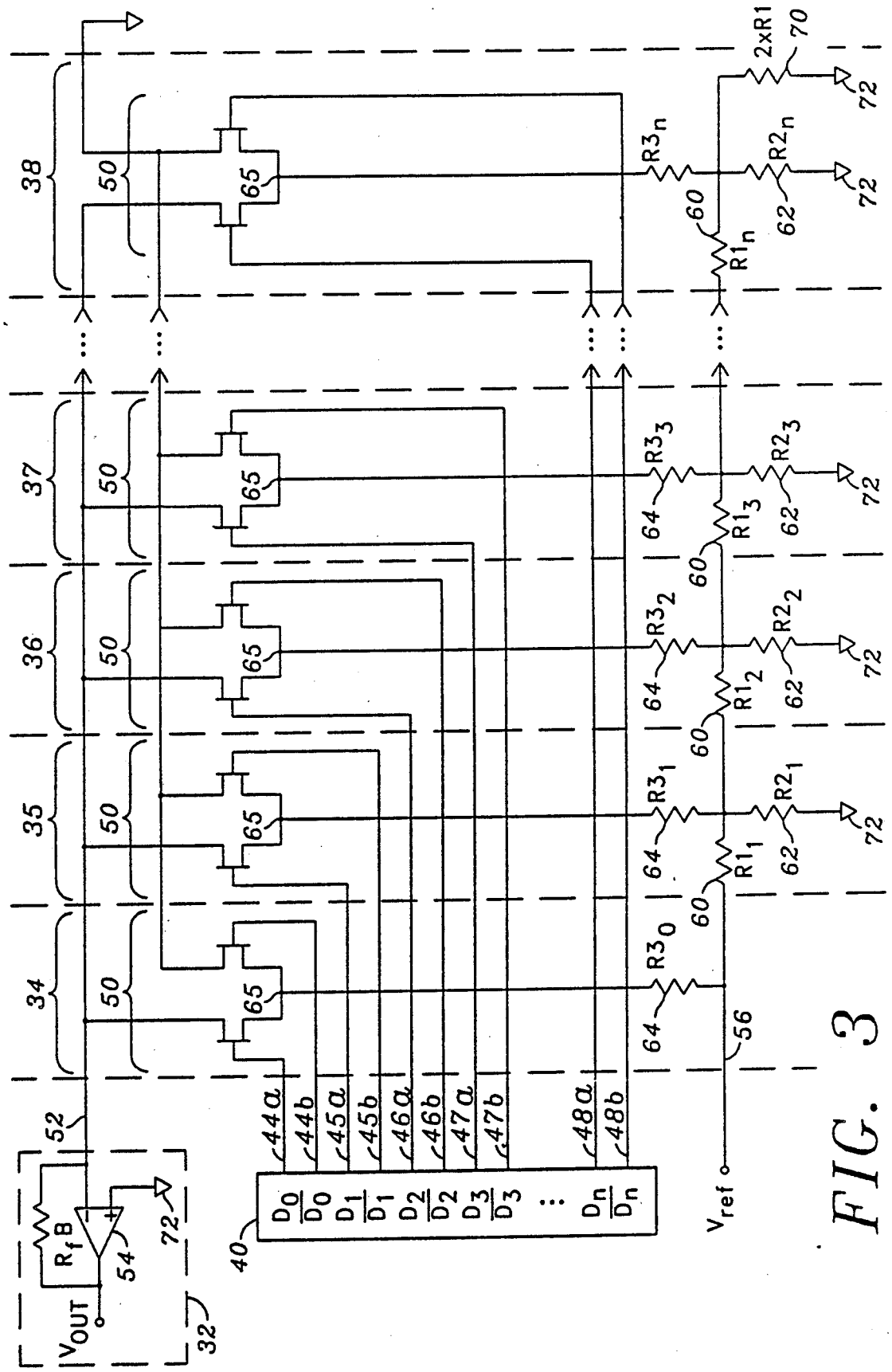
FIG. 3 is a schematic representation of circuitry in a digital-to-analog converter employing the R1-R2-R3 ladder of the present invention.

Referring to FIG. 3, there is illustrated a ladder-type circuit for a digital-to-analog converter in accordance with the present invention. The analog signal is output to a summing junction, shown generally as 32. As illustrated, the circuit comprises a plurality of separate but identical stages 34, 35, 36, 37 and 38 for each digit position in the binary input digital signal. As illustrated stages 34 through 37 receive the signal for the first four most significant bits and the stage 38 receives the signal for the least significant bit. The circuit as illustrated is designed for an arbitrary n bit digital signal and the stage 38 is the nth stage in the circuit. Intermediate stages are not shown for compactness of illustration but as mentioned, the intermediate stages are identical in configuration and operation as the stages shown.

The digital signal is input to the circuit from a register 40 through register output lines 44a, 45a, 46a, 47a and 48a and their digital complements 44b, 45b, 46b, 47b and 48b to the respective stages 34, 35 ,36, 37, and 38 of the circuit. The most significant digit signal is carried through the line 44a and 44b to the stage 34 and the least significant digit signal is carried through the output line 48a and 48b to the stage 38. Associated in each of the stages 34-38 is an electronic switch 50, preferably a pair of field effect transistors (FET). The preferred type of FET is the so called MOS FET which is well known for use in digital-to-analog circuits as a current switch and which has a low ON resistance and an extremely high OFF resistance.

Depending upon the potential in the associated register output line, the switch 50 is switched either to complete a circuit between the switch input 65 and an analog output line 52 to a common summing junction 32 at the operational amplifier 54 or to complete a circuit the switch input 65 and analog ground 72.

A reference voltage is introduced at point 56 of the first stage 34. The following stages are chained together (point 63 of one stage to point 56 of the next) as described in the detail of FIG. 2. The final stage 38 is terminated by attaching a resistor between point 56 and ground 72 with a resistance value of $2 \times R1$. The first stage 34 at point 56 will have one (and possibly several) stage(s) consisting solely of a resistor (R3) 74 attached to a switch 50 (as previously described). These initial bit(s) are termed mono-bits and are implemented in the fashion well understood by those versed in the art.

The linearity of the digital-to-analog converter utilizing the circuitry described above is mathematically predictable over a temperature range. Thus, linearity can be established by component relationships in accordance with the following equations.

$$P = T\left[\frac{R_{fet}}{R_{fet} + R_3}\right]\left[\frac{R_1}{R_{fet} + R_3}\right]$$

$$\left[\frac{1}{2}\right]\left[1 + \frac{1}{4} + \frac{1}{16} + \ldots\right]$$

$$V_o = \left[1 - \frac{1}{2^{N-1}}(P+1)^{(N-i)}\right]\left[\frac{(P+1)}{(1-p)}\right]$$

$$\text{Error} = \frac{1}{2}[V_o + 1]\left[\frac{(2^{(N-1)})}{(2^N - 1)}\right] - \frac{1}{2}$$

where $R_{FET}$ equals ON resistance of the FET and T equals Temperature induced change in FET ON resistance.

As an example, let R1 equal 2.5K$\Omega$; R3 equal 50K$\Omega$; T equal 30% over Delta 100° C.; $R_{FET}$ equal 50$\Omega$ and n equal 12 bits. In this example the relationship of the resistances between the resistor ($R2_n$) and the resistor ($R3_n$) is such that the resistor ($R3_n$) is 9 times greater than the resistor ($R2_n$). Where the ON resistance of the switch 50 is equivalent through all 12 stages, worst case linearity error occurring at about 100° C. above initial temperature, is equal to 0.0005%. This is an acceptable linearity error for a 16 bit digital-to-analog converter.

A converter designed in accordance with the present invention can also be configured with geometrically increasing FET ON resistance between each successive stage to generate a mathematically perfect digital-to-analog converter with linearity tracking over the temperature range. This ratio is determined in accordance with the following formula:

$$\text{Ratio} = 2.5 - \frac{R_1}{R_3} - \sqrt{\left(\left(\frac{R_1}{R_3}\right)^2 - 5\left(\frac{R_1}{R_3}\right) + \frac{9}{4}\right)}$$

where R1, R2 and R3 have the values set forth in the foregoing example.

The resulting ratio factor is 1.035 and thus the total ratio of the ON resistance for the most significant bit FET to the least significant bit FET for 12 bits is 1 to 1.5. Assuming an FET with an ON resistance of 50$\Omega$, the second FET would have an ON resistance of 51.75$\Omega$ increasing to 73$\Omega$ for the twelfth stage. Carrying on the example using the same resistances and FET ON resistance ratios, it will be seen that for a 16 bit FET the resistance for the most significant bit FET would be 83.8Ω. This is very low compared to the R/2R ladder as illustrated in FIG. 1 where for a 16 bit converter the ON resistance for the most significant bit FET would be 1.64 meg Ω.

The FET switches of each of the stages steer the current of the "ON" bits into the summing junction of an operational amplifier. Each bit acts independently of one another.

The resistance of the resistor 64 ($R3_n$) can not be made excessively large because of the adverse effect on the speed of the converter and for this reason should not exceed 30 times that of the resistor 62 ($R2_n$). Good results with respect to converter speed and accuracy are achieved when the resistance of the resistor 64 ($R3_n$) is approximately 10 times that of the resistor 62 ($R2_n$).

At the opposite end of the scale, if the resistance of resistor 64 ($R3_n$) were to approach two times the resistance of resistor 60 ($R1_n$) and resistor 62 ($R2_n$) were to become very large in resistance, the entire circuit would reduce to a conventional R/2R configuration and no improvement in accuracy would be realized. Accordingly, the resistance of resistor 64 ($R3_n$) is maintained at least three times greater than that of resistor 62 ($R2_n$).

From the foregoing it will be seen that the digital-to-analog converter and the circuitry employed therein, in accordance with the present invention, provides high resolution and accuracy for even large bit digital signals, i.e., on the order of 12 to 16 or greater. In accordance with the invention only minor adjustments in ON resistance of the FET switches of subsequent stages of a digital-to-analog converter will produce a mathematically accurate digital-to-analog converter over a temperature range assuming matching of FET ON resistance temperature coefficients. Moreover, if the ON resistance of the FET switches of subsequent stages is selected to be substantially equal, the error over a temperature range is small and within acceptable limits. Consequently, the ON resistance of the FET switches is of far less criticality than for a conventional R/2R ladder configuration thus reducing the cost of manufacture for the FET switches and the resultant overall cost of the digital-to-analog converter.

It will be understood that digital-to-analog converters designed in accordance with the present invention may be produced by any of the known technologies such as for example, thick film and thin film techniques, bipolar circuitry, hybrid technology, CMOS integrated circuitry or discrete circuit boards.

As will be understood by those skilled in the art, various arrangements other than those described in detail in the specification will occur to those persons skilled in the art, which arrangements lie within the spirit and scope of the invention. It is therefor to be understood that the invention is to be limited only by the claims appended hereto.

Having described the invention, I claim:

1. A digital to analog converter comprising a resistor ladder configuration having a first stage, a plurality of successive stages and a last stage, each of said successive stages and said last stage having an input side and an output side, switching means for steering current and resistor means for maintaining linearity over a temperature range, said resistor means consisting of a first resistor (R1), a second resistor (R2) and a third resistor (R3) each having first and second ends, said first end of said resistor (R1) of said successive stages and said last stage being electrically connected to the output side of a preceding stage, said second end of said resistor (R1) of each successive stage being electrically connected to the input end of a successive stage of said ladder configuration and said second end of said first resistor (R1) of said last stage being connected to a resistor having twice the resistance of said first resistor, said first ends of said resistors R2 and R3 being electrically connected to said second end of said resistor R1, said second end of said resistor R3 being electrically connected to said switching means of said stage and said second end of said resistor R2 being electrically connected to ground, said resistance of resistor R3 being greater than that of said resistor R2.

2. The digital to analog converter of claim 1 wherein said resistors R2 and R3 in parallel have a resistance equivalent to twice that of said resistor R1.

3. The digital to analog converter of claim 1 wherein the resistance of said resistor R3 is 3 to 30 times greater than that of said resistor R2.

4. The digital to analog converter of claim 1 wherein the ON resistance of said switching means of each stage is essentially equivalent.

5. The digital to analog converter of claim 1 wherein said switching means of each said stage have an equal ON resistance.

6. The digital to analog converter of claim 1 wherein said switching means is a field effect transistor (FET).

7. The digital to analog converter of claim 6 wherein ON resistance of each succeeding FET stage increases by the ratio;

$$\text{Ratio} = 2.5 - \frac{R_1}{R_3} - \sqrt{\left(\left(\frac{R_1}{R_3}\right)^2 - 5\left(\frac{R_1}{R_3}\right) + \frac{9}{4}\right)}$$

8. The digital to analog converter of claim 6 wherein said field effect transistor of each said stage has an ON resistance essentially equal to that of said field effect transistors of each said other stages.

9. The digital to analog converter of claim 6 wherein each said field effect transistor in said converter are equal in size.

* * * * *